United States Patent
Fujiwara

(10) Patent No.: US 7,986,188 B2
(45) Date of Patent: Jul. 26, 2011

(54) NON-INVERTING AMPLIFIER CIRCUIT, SEMICONDUCTOR INTEGRATED CIRCUIT, AND PHASE COMPENSATION METHOD OF NON-INVERTING AMPLIFIER CIRCUIT

(75) Inventor: Atsushi Fujiwara, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/753,624

(22) Filed: Apr. 2, 2010

(65) Prior Publication Data
US 2010/0253431 A1    Oct. 7, 2010

(30) Foreign Application Priority Data
Apr. 3, 2009    (JP) ................................ 2009-091327

(51) Int. Cl.
*H03F 1/14* (2006.01)
(52) U.S. Cl. ......... 330/292; 330/260; 330/257; 323/316
(58) Field of Classification Search ............... 330/292, 330/260, 257; 323/316
See application file for complete search history.

(56) References Cited

U.S. PATENT DOCUMENTS

| | | | | |
|---|---|---|---|---|
| 6,104,179 A * | 8/2000 | Yukawa | ............... | 323/316 |
| 6,665,525 B2 * | 12/2003 | Dent et al. | ............... | 455/108 |
| 6,737,841 B2 * | 5/2004 | Wrathall | ............... | 323/282 |
| 6,798,284 B2 * | 9/2004 | Oda | ............... | 330/86 |
| 7,049,879 B2 * | 5/2006 | Osamura et al. | ............... | 327/419 |
| 7,408,390 B2 * | 8/2008 | Yamada | ............... | 327/124 |
| 7,746,168 B2 * | 6/2010 | Oishi | ............... | 330/252 |

FOREIGN PATENT DOCUMENTS
JP    2002-297248 A    10/2002
* cited by examiner

*Primary Examiner* — Patricia Nguyen
(74) *Attorney, Agent, or Firm* — Sughrue Mion, PLLC

(57) ABSTRACT

A circuit includes a differential amplifier unit that receives an input signal at a non-inverting input thereof, a constant current source, a load circuit, an output transistor that receives an output of the differential amplifier unit as an input and drives a load circuit, a phase compensation circuit including a variable resistor and a capacitor connected in series between the input of the output transistor and a feedback path, an output current monitor circuit that detects an output current flowing through the output transistor, and a bias voltage generation circuit that varies a resistance value of the variable resistor in accordance with a result of the detection of the output current by the output current monitor circuit. A signal obtained by voltage dividing an output of the output transistor by resistors is supplied to an inverting input of the differential amplifier unit.

25 Claims, 5 Drawing Sheets

BROKEN LINE: COMPARATIVE EXAMPLE
SOLID LINE: PRESENT INVENTION

LARGER Iout
(z0 ∝ Iout)

BASIC CHARACTERISTICS OF REGULATOR

NON-INVERTING AMPLIFIER CIRCUIT, SEMICONDUCTOR INTEGRATED CIRCUIT, AND PHASE COMPENSATION METHOD OF NON-INVERTING AMPLIFIER CIRCUIT

TECHNICAL FIELD

REFERENCE TO RELATED APPLICATION

This application is based upon and claims the benefit of the priority of Japanese patent application No. 2009-091327 filed on Apr. 3, 2009, the disclosure of which is incorporated herein in its entirety by reference thereto.

The present invention relates to a semiconductor integrated circuit. More specifically, the invention relates to a non-inverting amplifier circuit, a semiconductor integrated circuit device including the non-inverting amplifier circuit, and a phase compensation method.

BACKGROUND

A voltage regulator (constant voltage circuit) includes a differential amplifier unit that receives a reference voltage Vref at a non-inverting input thereof, an output transistor, and voltage dividing resistors that perform voltage division of an output of the output transistor. By negatively feeding back an output of the voltage regulator to an inverting input of the differential amplifier unit, a constant voltage is output at an output terminal of the voltage regulator. The differential amplifier unit and the output transistor of the voltage regulator each have a pole (at which a denominator of a transfer function equals 0) and a frequency characteristic in which a gain decreases and a phase is delayed with the increase of the frequency from the pole. Assume a phase margin (Phase Margin: P. M.) is small when the gain has decreased to 0 dB. Then, an operation of the circuit becomes unstable. If the gain assumes 0 dB or more (when the gain assumes 1 or more) and the phase is delayed by 180 degrees, the circuit oscillates. The phase margin (P. M.) indicates how much margin is present from the phase of −180 degrees when the gain is 0 dB in the frequency characteristic.

A phase compensation circuit formed of a phase compensation capacitor and a phase compensation resistance is connected to a non-inverting amplifier circuit (non-inverting input type negative feedback amplifier circuit) such as the voltage regulator or a voltage follower so as to prevent oscillation and stabilize operation. By doing so, a zero (at which a numerator of the transfer function equals 0) having a property opposite to the pole is generated to ensure the phase margin. A frequency corresponding to a bending point on a frequency characteristic of the non-inverting amplifier circuit is referred to as the pole. The phase is delayed by 90 degrees from 0.1 fp to 10 fp, where fp is a pole frequency. With the increase of a frequency occurs from a zero-point frequency (=1/(2πCR)), the phase advances. For example, the phase advances by 90 degrees from 0.1 fz to 10 fz, where fz is a zero point frequency. This phase advancement cancels a phase delay caused by the pole (performs phase compensation), ensures a phase margin, and prevents oscillation. In this way, the phase is compensated in the non-inverting amplifier circuit.

The voltage regulator as the non-inverting amplifier circuit will be described below. FIG. 4 is a diagram showing a circuit configuration of the voltage regulator related to the invention of this application. FIG. 4 is used for explaining problems and an analysis of this application, which will be described later.

Referring to FIG. 4, a voltage regulator 10' comprises:

(A) an nMOS transistor (constant current source transistor) NM3 which has a source connected to the ground and has a gate supplied with a bias voltage VB;

(B) a pair of nMOS transistors NM1 and NM2 which have sources coupled in common to a drain of the nMOS transistor NM3 and have gates respectively supplied with a reference voltage Vref (supplied from a reference voltage circuit not shown) and a feedback voltage (voltage obtained by voltage-dividing an output terminal voltage Vout by resistors Rf and Rs), and which forms a differential pair;

(C) a pMOS transistor PM1 which has a source connected to a power supply VDD and has a drain connected to a drain of the nMOS transistor NM1 and a pMOS transistor PM2 which has a source connected to the power supply VDD, has a gate connected to a gate of the pMOS transistor PM1, and has the gate and a drain thereof connected to each other to a drain of the nMOS transistor NM2 (the pMOS transistors PM1 and PM2 being a load circuit for the differential pair and forming a current mirror);

(D) a pMOS transistor PM3 (also referred to as an output transistor or an output driver) which has a source connected to the power supply VDD, has a gate connected to the drain of the nMOS transistor NM1, and has a source connected to an output terminal OUT;

(E) a resistor Rf (also referred to as a feedback resistor) and a resistor Rs which are connected between the source of the pMOS transistor PM3 and the ground and which form voltage-dividing resistors; and (F) a resistor Rz (phase compensation resistance, which produces the zero of a frequency characteristic, also termed as a zero-point resistor) and a capacitor Cc connected in series between a gate node N1 of the pMOS transistor PM3 and a connection node (node N2) of the resistor Rf and the resistor Rs.

The nMOS transistors NM1 and NM2 (differential pair), nMOS transistor NM3 (constant current source), and pMOS transistors PM1 and PM2 (load circuit) form a differential amplifier unit. The pMOS transistor PM3 and the resistors Rf and Rs form an output stage unit. The resistor Rz and the capacitor Cc form a phase compensation unit. An external circuit (load circuit) is connected to the output terminal OUT. A compensation capacitor C is externally connected between the output terminal OUT and the ground.

Assuming that a voltage at the output terminal OUT is Vout in the circuit in FIG. 4, from the following equation (1), Vout is given by the following equation (2).

$$Vref = Vout \times \frac{Rs}{Rf + Rs} \quad (1)$$

$$Vout = Vref \times \left(1 + \frac{Rf}{Rs}\right) \quad (2)$$

Based on this equation (2), the well-known gain formula of the non-inverting amplifier circuit is derived as follows:

$$\text{Gain} = \frac{Vout}{Vref} = 1 + \frac{Rf}{Rs} \quad (3)$$

The frequency characteristic of the circuit in FIG. 4 depends on an output current (load current) Iout of the pMOS transistor PM3 (output transistor). FIG. 5A is a diagram which schematically shows the frequency characteristic of the circuit in FIG. 4. An AC signal is supplied (to the gate of the nMOS transistor NM1) in FIG. 4 as an input, instead of the reference voltage Vref that is a DC signal, with the frequency being swept, and a gain characteristic and a phase characteristic with respect to a frequency are plotted. In FIG. 5A, a horizontal axis indicates the frequency, a left-side vertical axis indicates a gain, and a right-side vertical axis indicates a phase. The frequency characteristic can be obtained by circuit simulation as well. FIG. 5B shows frequency characteristics of a gain and a phase in case the output current Iout in FIG. 4 is set to be larger than in FIG. 5A (wherein a horizontal axis indicates a frequency, a left-side vertical axis indicates the gain, and a right-side vertical axis indicates the phase).

Referring to FIGS. 5A and 5B, p0, p1, and p2 respectively denote first, second, and third poles, and z0 denotes a zero (zero-point frequency). A phase (Phase) corresponding to the gain of 0 dB (refer to arrows) corresponds to a phase margin (PM), which shows to what extent there is a margin from –180 degrees. When the gain is 0 dB (factor 1) and the phase is rotated by –180 degrees or less, the non-inverting amplifier circuit may possibly oscillate.

When the output current Iout increases as shown in FIG. 5B, the phase margin decreases more than in FIG. 5A. If the output current Iout further increases, the zero-point frequency z0 increases in substantial proportion to the output current Iout. Thus, it is difficult to cancel a phase delay caused by the pole.

FIG. 5C is a diagram showing relationships among the output current (load current) Iout of the voltage regulator in FIG. 4 (plotted on a horizontal axis), gain (Gain), output voltage Vout, and phase margin (P. M.) (plotted on a vertical axis). FIGS. 5A to 5C are prepared by the inventor of this invention.

When a range of the output current Iout is wide as shown in FIG. 5C, frequency characteristic adjustment becomes difficult. Among the frequency characteristics, a characteristic of phase margin (P. M.) in particular is greatly influenced by the output current Iout. As the output current Iout increases, the characteristic of phase margin (P. M) attenuates. On an upper limit side of the output current Iout, the phase margin approaches a specification lower limit (lower limit for compensating for an operation). When the output current Iout of the pMOS transistor PM3 increases, the voltage Vout of the output terminal OUT decreases (due to a voltage drop from the supply voltage VDD, caused by an impedance of the output terminal out, for example). Accordingly, when the output current Iout increases, the gain=Vout/Vref is reduced, as shown in FIG. 5C.

Patent Document 1 discloses a voltage regulator including a phase compensation control circuit. This phase compensation control circuit is provided for a phase compensation circuit. In the phase compensation circuit, a phase of a feedback voltage VFB of an operational amplifier is advanced, thereby performing phase compensation. In the phase compensation control circuit, short-circuit control of a phase compensation resistance is performed according to an output current of an output driver (transistor), detected by a current detection unit. The phase compensation control circuit thereby performs control so that a time constant of the phase compensation circuit is changed. Then, the phase compensation control circuit performs control of a frequency at which phase compensation is performed on the feedback voltage VFB. Referring to Patent Document 1, when the output current is determined to be a predetermined value or more by a current detection circuit, an nMOS transistor inserted in series with a capacitance between a drain of the output driver and a voltage division node between voltage dividing resistors is controlled to be turned on. A time constant of a phase compensating capacitance is thereby reduced. Even if a frequency at which a phase delay is generated by the output driver transistor is shifted to a high frequency side, a frequency at which phase compensation is performed by the phase compensation circuit is shifted to the high frequency side. A phase margin is thereby increased. Patent Document 1 JP Patent Kokai Publication No. JP-P-2002-297248A

SUMMARY

The following analysis is given by the present inventor.

In the circuit shown in FIG. 4, a phase margin (P. M.) greatly depends on an output current (Iout). Flattening a phase margin (P. M.) vs. output current (Iout) characteristic is a great challenge, when an analog circuit such as an OP amplifier of a voltage follower configuration or a voltage regulator is designed.

The present invention which tries to solve at least one of the above-mentioned problems, may be summarized as follows.

According to the present invention, there is provided a non-inverting amplifier circuit comprising:

a differential amplifier unit that receives an input signal at a non-inverting input thereof;

an output transistor that receives an output of the differential amplifier unit as an input, an output of the output transistor being fed back to an inverting input of the differential amplifier unit through a feedback path;

a phase compensation circuit including a variable resistor and a capacitance connected in series between the input of the output transistor and the feedback path for the output of the output transistor;

an output current monitor circuit that detects an output current flowing through the output transistor; and a circuit that varies a resistance value of the variable resistor of the phase compensation circuit according to a result of the detection of the output current by the output current monitor circuit.

According to the present invention, there is provided a phase compensation method of a non-inverting amplifier circuit, the non-inverting amplifier circuit that includes: a differential amplifier unit that receives an input signal at a non-inverting input thereof; an output transistor that receives an output of the differential amplifier unit as an input, an output of the output transistor being fed back to an inverting input of the differential amplifier unit through a feedback path; and a phase compensation circuit including a variable resistor and a capacitance connected in series between the input of the output transistor and the feedback path for the output of the output transistor, the method comprising:

monitoring an output current flowing through the output transistor; and varying a resistance value of the variable resistor of the phase compensation circuit according to a result of the detection of the output current.

According to the present invention, dependence of a phase margin on an output current in the non-inverting amplifier circuit can be reduced, and a phase margin vs. output current characteristic can be flattened.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES

Figure 1:
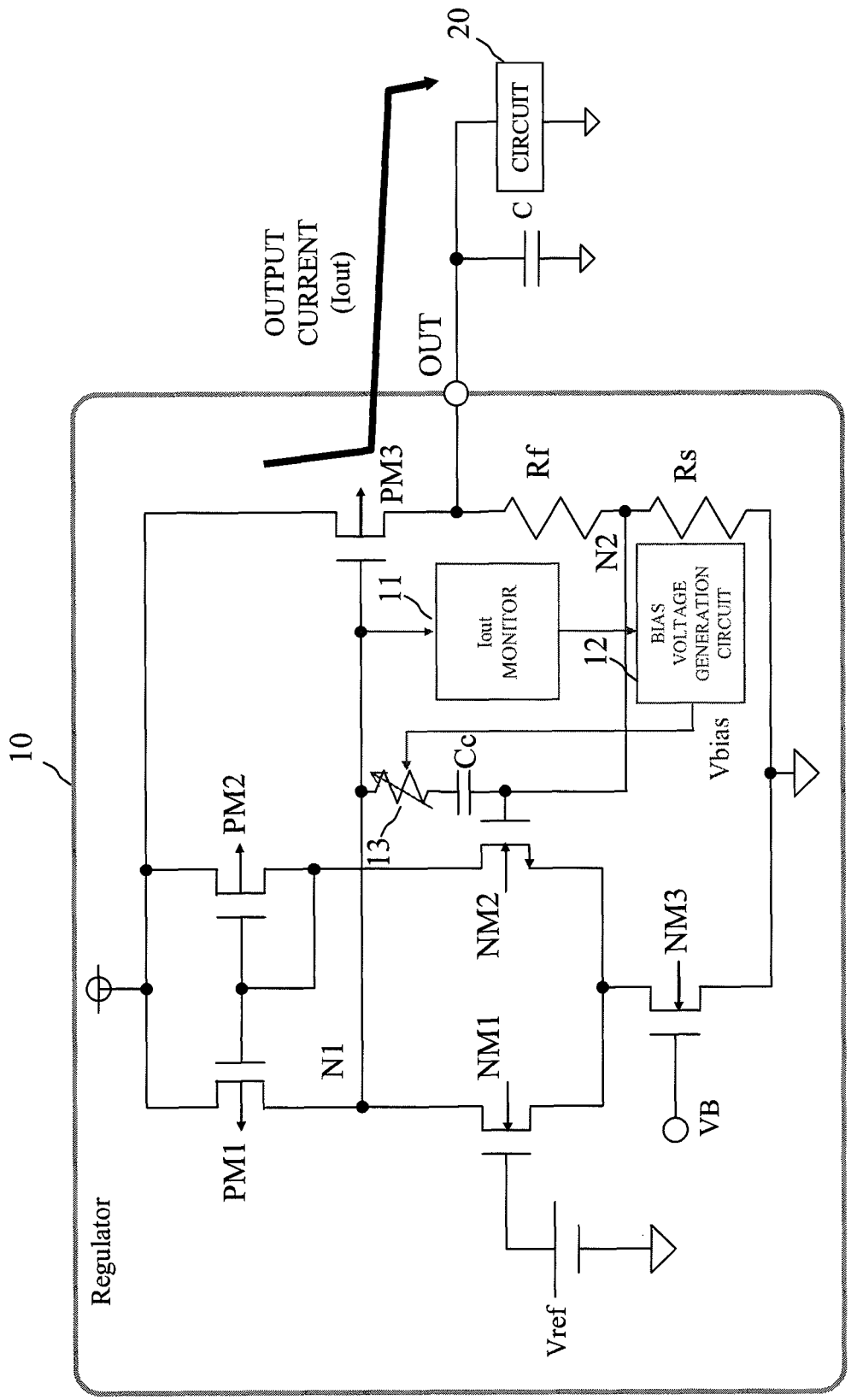
FIG. 1 is a diagram showing a configuration of an example of the present invention.

A typical example of technical concepts of the present invention for solving at least one of the problems is shown in the following FIG. 1. Needless to say, the claimed contents of the present application are not limited to this technical concept, and described in the claims of the present application. FIG. 1 is a diagram showing a configuration of a voltage regulator according to an exemplary embodiment of the present invention. Referring to FIG. 1, same reference characters are assigned to elements that are the same as or comparable to elements in FIG. 4.

The circuit according to this exemplary embodiment comprises a phase compensation circuit and an Iout monitor circuit (11) (also referred to as an "output current monitor circuit") that detects an output current flowing through an output transistor (PM3). The phase compensation circuit includes a variable resistor (13) and a capacitor (Cc), inserted in series between an input (gate) of the output transistor (PM3) and a feedback path. The output transistor (PM3) receives at an input (gate) thereof an output of a differential amplifier unit, and drives a load circuit. The differential amplifier unit receives a signal at a non-inverting input terminal thereof. According to a result of the detection of the output current by the Iout monitor circuit (11), a resistance value of the variable resistor (13) of the phase compensation circuit is varied.

That is, the non-inverting amplifier circuit in the exemplary embodiment of the present invention includes a feedback loop that feedbacks an output current Iout and controls the variable resistor (13) for phase compensation so as to flatten a phase margin vs. output current characteristic. This feedback loop comprises the Iout monitor circuit (11) that monitors the output current Iout, a bias voltage generation circuit (12) that generates a bias voltage, and the variable resistor (13) that can vary its resistance value according to the bias voltage.

In the following example, the voltage regulator will be described as the non-inverting amplifier circuit. The invention may be similarly applied to a voltage follower as well.

Referring to FIG. 1, a voltage regulator 10 in the exemplary embodiment of the present invention comprises:

(A) an NMOS transistor (constant current source transistor) NM3 which has a source connected to the ground and has a gate supplied with a bias voltage VB;

(B) a pair of nMOS transistors NM1 and NM2 which have sources coupled in common to a drain of the nMOS transistor NM3 and has gates respectively supplied with a reference voltage Vref and a feedback voltage (voltage obtained by voltage dividing an output terminal voltage Vout by resistors R and Rs) and which form a differential pair;

(C) a pMOS transistor PM1 which has a source connected to a power supply VDD and has a drain connected to a drain of the nMOS transistor NM1, and a pMOS transistor PM2 which has a source connected to the power supply VDD, has a gate connected to a gate of the pMOS transistor PM1, and has the gate and a drain connected to a drain of the nMOS transistor NM2 (the pMOS transistors PM1 and PM2 constituting a load on the differential pair and forming a current mirror);

(D) a pMOS transistor PM3 (output transistor) which has a source connected to the power supply VDD, has a gate connected to the drain of the nMOS transistor NM1, and has a drain connected to an output terminal OUT;

(E) a resistor Rf (also termed as a "feedback resistor") and a resistor Rs which constitute voltage-dividing resistors and which are connected in series between the drain of the pMOS transistor PM3 and the ground;

(F) a variable resistor (also termed as a "zero-point control resistor") 13 and a capacitor Cc connected in series between a gate node N1 of the pMOS transistor PM3 and a connection node (node N2) of the resistors Rf and Rs;

(G) the Iout monitor circuit 11 that monitors an output current Iout flowing through the pMOS transistor PM3 (output driver); and (H) the bias voltage generation circuit 12 that generates a bias voltage based on a result of monitoring by the Iout monitor circuit 11.

The bias voltage generated by the bias voltage generation circuit 12 in this exemplary embodiment is supplied to the variable resistor 13 to vary the resistance value of the variable resistor 13.

The elements (A) to (C) constitute a differential amplifier unit, the elements (D) and (E) constitute an output stage unit, and the element (F) constitutes a phase compensation unit. In the case of a voltage follower configuration having a gain of 1, the resistors Rf and Rs are removed from FIG. 1, the gate of the nMOS transistor NM2 is connected to the drain of the pMOS transistor PM3 (output terminal OUT), and the capacitor Cc and the variable resistor 13 of the phase compensation unit are connected in series with the gate and the drain of the pMOS transistor PM3.

Figure 2:
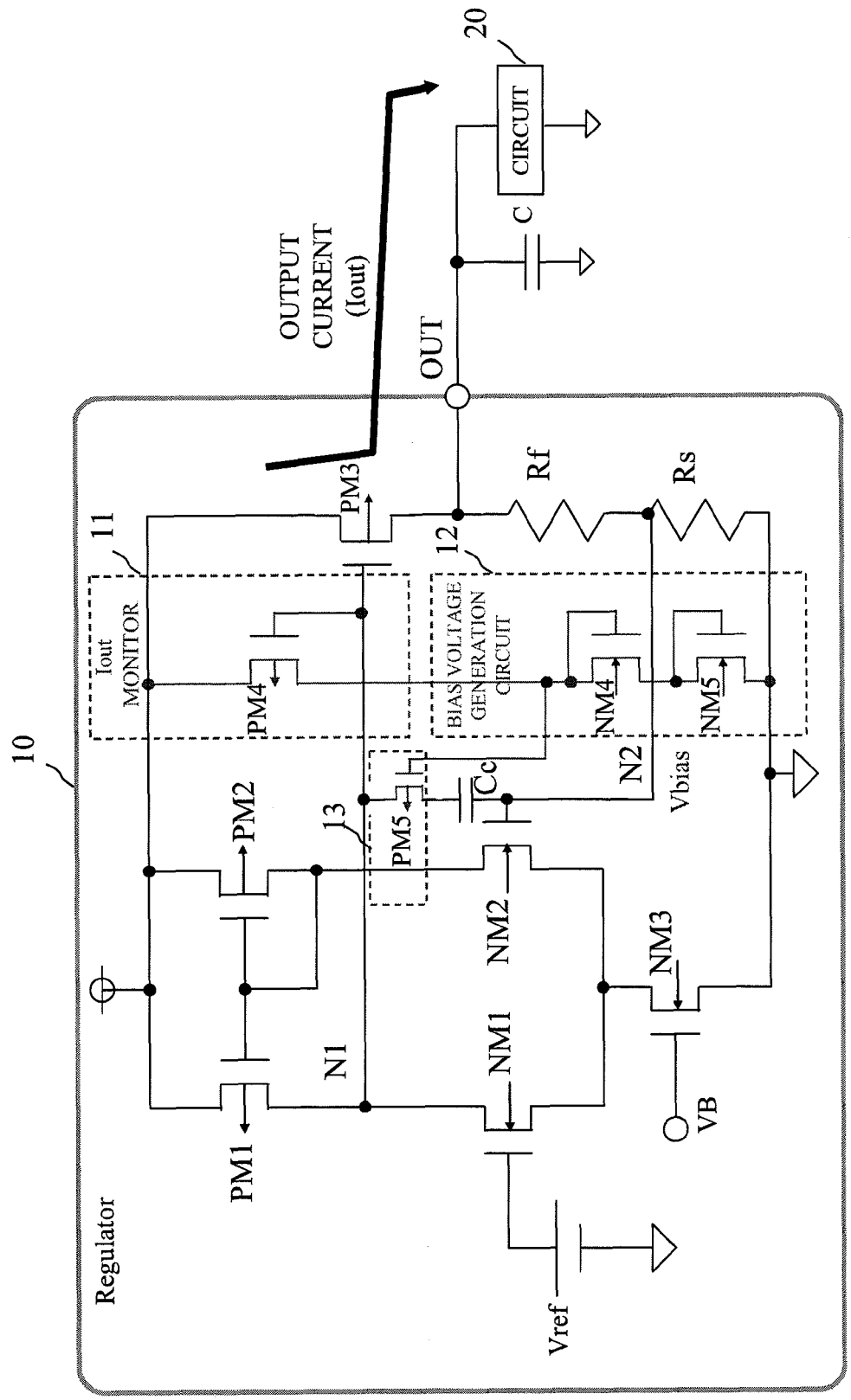
FIG. 2 is a diagram showing a configuration of the example of the present invention.

FIG. 2 is a diagram showing a configuration of an specific example of the present invention. FIG. 2 shows circuit configurations of the Iout monitor circuit 11, bias voltage generation circuit 12, and variable resistor 13 respectively configured at a transistor level, as a specific example of the configuration in FIG. 1.

Referring to FIG. 2, the Iout monitor circuit 11 includes a pMOS transistor PM4 which has a source connected to the power supply VDD, has a gate connected to the gate of the pMOS transistor PM3 and the output node N1 of the differential amplifier unit (connection node at which the drains of the nMOS transistor NM1 and the pMOS transistor PM1 are connected together). Current obtained by monitoring the output current Iout (drain current of the pMOS transistor PM3) is output from the drain of the pMOS transistor PM4.

In this example, the current that flows through the pMOS transistor PM4 of the Iout monitor circuit 11 is set to a predetermined fraction (one nth) of a current that flows through the pMOS transistor PM3. For example, the size (W/L, where W is a gate width, and L is a gate length) of the pMOS transistor PM4 is set to one nth of the size (W/L) of the pMOS transistor PM3 (where n>1). The n is determined by current consumption and analog characteristics of an actual circuit. Since gate-to-source voltages of the pMOS transistors PM4 and PM3 are common, the current (source-to-drain current) that flows through the pMOS transistor PM4 assumes one nth of the current that flows through the pMOS transistor PM3.

Though no particular limitation is imposed, the bias voltage generation circuit 12 comprises a current-to-voltage conversion circuit including diode-connected nMOS transistors NM4 and NM5 that are cascode-connected in two stages. The bias voltage generation circuit 12 converts a current of the output current monitor circuit 11 to the bias voltage. That is, the nMOS transistor NM4 has a gate and a drain connected in common to the drain of the pMOS transistor PM4 of the output current monitor (Iout monitor) circuit. The nMOS transistor NM5A has a gate and a drain connected in common to a source of the nMOS transistor NM4 and has a source connected to the ground.

The variable resistor 13 includes a pMOS transistor PM5 which has a source connected to the node N1, has a gate connected to the drain of the MOS transistor NM4 of the bias voltage generation circuit 12, and has a drain connected to one end of the capacitor Cc.

While the output current Iout (source-to-drain current) flows through the pMOS transistor PM3, a current Iout/n flows through the pMOS transistor PM4 and the nMOS transistors NM4 and NMS.

A bias voltage Vbias corresponds to two gate-to-source voltages $V_{GS}$ of the nMOS transistors NM4 and NM5. Assuming that a drain current of each of the nMOS transistors NM4 and NM5 is indicated by Id, the current Id is given by:

$$Id = \frac{\beta}{2}(V_{GS} - V_{TH})^2 \quad (4)$$

(where β is a gain coefficient of the MOS transistor M4 (M5), and $V_{TH}$ is a threshold value of the MOS transistor M4 (M5)) Accordingly, the gate-to-source voltage $V_{GS}$ is given by:

$$V_{GS} = V_{TH} + \sqrt{\frac{2Id}{\beta}} \quad (5)$$

Since the bias voltage Vbias corresponds to two gate-to-source voltages $V_{GS}$, the bias voltage Vbias is given by:

$$Vbias = 2\left(V_{TH} + \sqrt{\frac{2Id}{\beta}}\right) \quad (6)$$

This bias voltage Vbias is applied to the gate of the pMOS transistor PM5 of the variable resistor 13, and an on resistance of the pMOS transistor PM5 is varied according to the bias voltage Vbias. This varies the zero-point frequency (=1/(2πCR)) of the voltage regulator, compensates for a phase delay, and controls a frequency characteristic.

When the output current Iout of the pMOS transistor PM3 increases in this example, the current Iout/n that flows through the Iout monitor circuit 11 also increases. The bias voltage Vbias rises according to Expression (6). As a result, the on resistance of the pMOS transistor PM5 increases. More specifically, when the output current Iout increases, the voltage Vout of the output terminal OUT decreases. A voltage at a voltage division node (node N2) of the resistors Rf and Rs also falls. A gate potential at the nMOS transistor NM2 on an inverting input side of the differential pair also falls, the current (drain current) that flows through the nMOS transistor NM2 decreases, and the current that flows through the nMOS transistor NM1 on a non-inverting side of the differential pair increases. A potential at the drain of the nMOS transistor NM1 thereby falls. Accordingly, a potential at the gate (node N1) of the pMOS transistor PM3 falls. The current mirror (formed of the pMOS transistors PM1 and PM2) is controlled so that the currents (drain currents) that flow through the differential pair (formed of the nMOS transistors NM1 and NM2) are balanced. When the voltage at the node N2 falls due to lowering of the output voltage Vout, a drain voltage of the pMOS transistor PM5 also falls due to capacitive coupling of the capacitor Cc. Accordingly, when the output current Iout increases, the bias voltage Vbias rises and the absolute value of a gate-to-source voltage of the pMOS transistor PM5 decreases. Thus, the on resistance value of the pMOS transistor PM5 increases. When the on resistance value of the pMOS transistor PM5 increases, the zero-point frequency (=1/(2πCR)) in the frequency characteristics of the voltage regulator decreases.

For this reason, according to this example, even when the output current Iout increases, a phase delay can be compensated for.

Figure 5A:
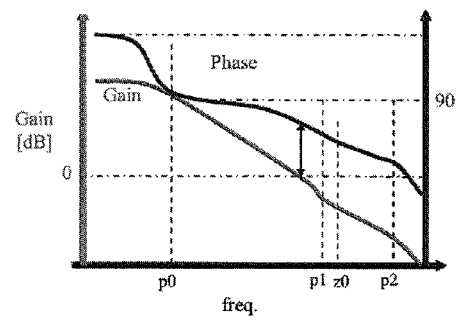
FIG. 5A is a graph showing frequency characteristics of the circuit in FIG. 4.
Figure 5B:
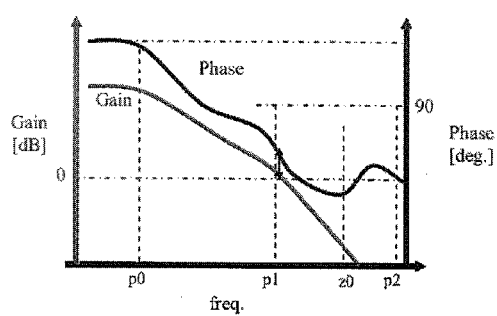
FIG. 5B is a graph showing frequency characteristics of the circuit in FIG. 4.
Figure 5C:
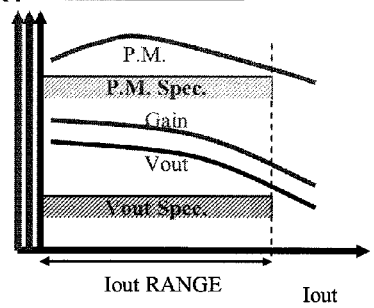
FIG. 5C is a graph showing a characteristic of an output current (Iout), a characteristic of a phase margin (P. M.), a characteristic of a gain (Gain), and a characteristic of an output voltage (Vout).

In case just one pole is present in a frequency range up to a frequency at which the gain assumes 0 dB (gain equals 1) as shown in FIG. 5A, the phase is delayed just by approximately 90 degrees. Thus, the circuit does not oscillate. In case two poles are present in the frequency range up to a frequency at which the gain assumes 0 dB (gain equals 1) as shown in FIG. 5B, the phase is delayed by 180 degrees at maximum due to the two poles. In an example (of a related art) in FIG. 5B, when the output current Iout increases, the zero-point frequency z0 increases (is shifted to a high frequency side) in proportion to the output current Iout. For this reason, a phase delay caused by a second pole p1 cannot be canceled. The circuit may therefore possibly oscillate. On contrast therewith, according to this example, when the output current Iout increases, the zero-point frequency z0 is reduced (is shifted to a low frequency side), and the phase is advanced. The phase delay caused by the second pole pl can be thereby canceled.

On the other hand, when the output current Iout of the pMOS transistor PM3 decreases, the current (=Iout/n) that flows through the Iout monitor circuit 11 decreases. When the monitor current (=Iout/n) decreases, the bias voltage Vbias falls. When the bias voltage Vbias falls, the on-resistance value of the pMOS transistor PM5 decreases. For this reason, when the output current Iout decreases in the frequency characteristic of the voltage regulator in FIG. 2, the zero-point frequency increases. More specifically, when the output current Iout decreases, the voltage Vout of the output terminal OUT rises. The voltage at the voltage division node (node N2) of the resistors Rf and Rs also rises. The gate potential at the nMOS transistor NM2 rises, and the drain current of the nMOS transistor NM2 increases. For this reason, the drain current of the nMOS transistor NM1 decreases, and the potential at the drain (node N1) of the nMOS transistor NM1 rises. When the voltage at the node N2 rises, the drain voltage of the pMOS transistor PM5 also increases due to the capacitive coupling of the capacitor Cc. Accordingly, when the bias voltage Vbias falls, the absolute value of the gate-to-source voltage of the pMOS transistor PM5 increases. Thus, the on-resistance value of the pMOS transistor PM5 decreases. When the output current Iout decreases in the frequency characteristic of the voltage regulator, the zero-point frequency (which is proportional to the inverse of a CR time constant) increases. When the output current Iout is small as shown in FIG. 5A, for example, and just one pole is present in the frequency range up to a frequency at which the gain assumes 0 dB (gain equals 1), the phase is delayed just by approximately 90 degrees. Thus, there is no problem if the zero-point frequency is increased more than in the case where the output current Iout is large.

Figure 4:
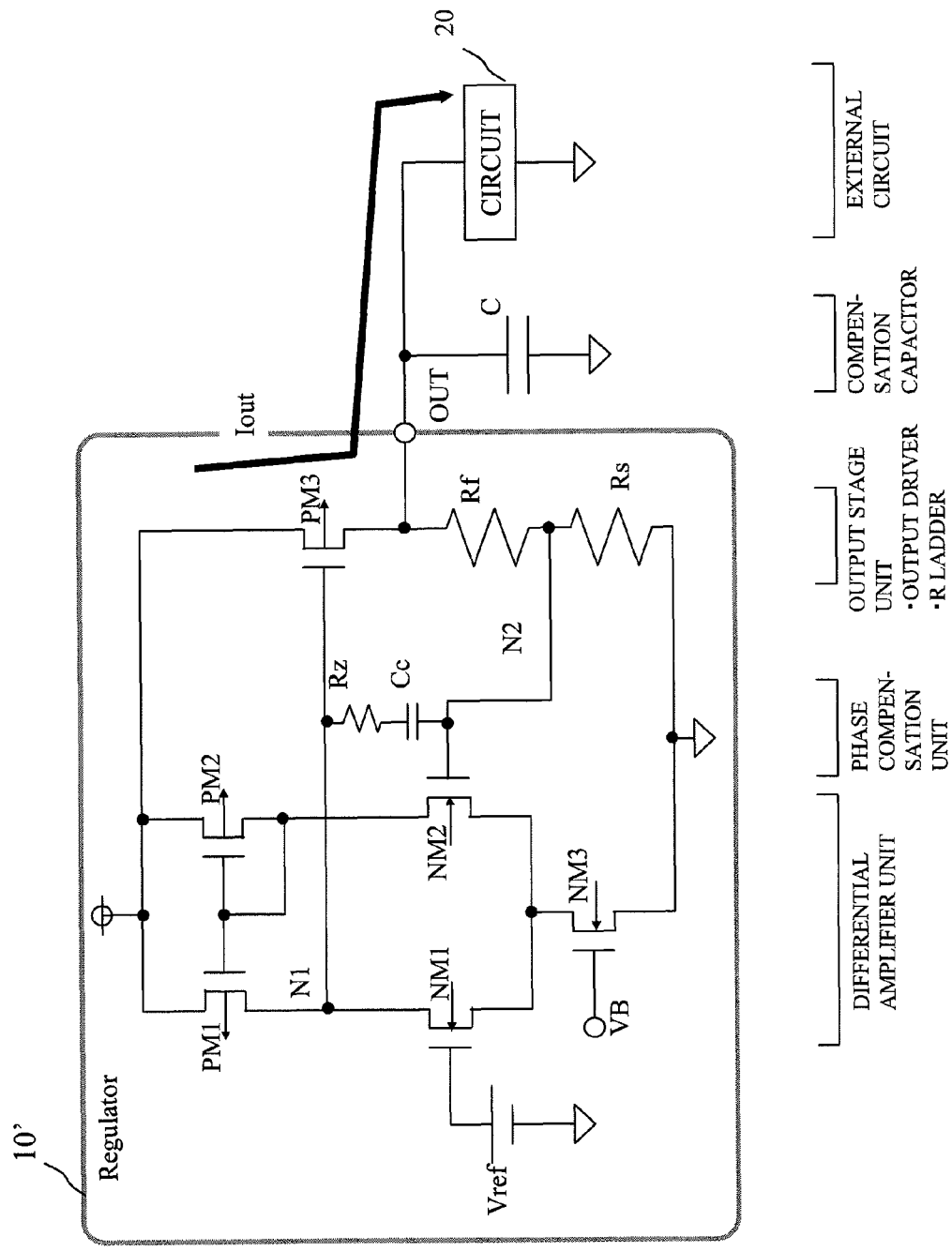
FIG. 4 is a diagram that shows a configuration of a voltage regulator and is related to the invention of this application for explaining an object and an analysis of this application.

In a circuit in FIG. 4, described as a contrast for showing an effect of this application, the zero-point frequency z0 increases in proportion to an increase in the output current Iout (z0∝Iout). When the output current Iout increases in this example, the zero-point frequency z0 is reduced by increasing the resistance value of the variable resistor 13 to perform phase compensation. Oscillation is thereby prevented.

Figure 3:
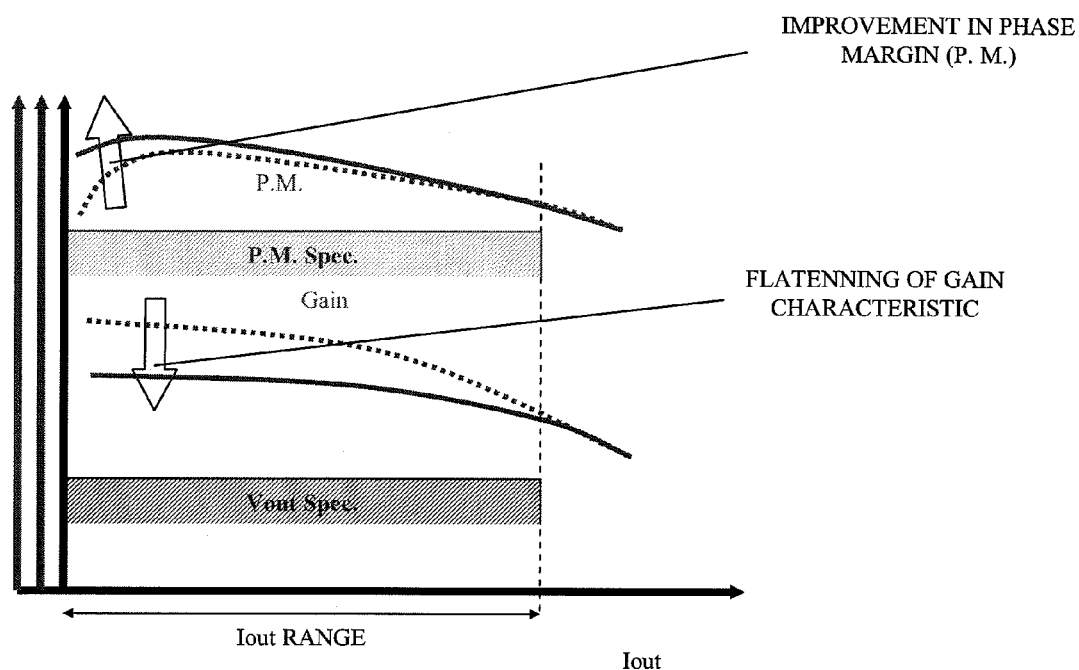
FIG. 3 is a graph showing output currents and phase margins (gain characteristics) in the present invention and a comparative example.

FIG. 3 is a graph showing a relationship between the output current Iout and the phase margin in each of this example (indicated by a solid line: present invention) and the circuit in FIG. 4 (indicated by a broken line: comparative example). When the output current Iout increases in the case of the circuit in FIG. 4 (comparative example), the zero-point frequency also increases.

According to this example, when the output current Iout increases, control can be performed so that the zero-point frequency is reduced. The phase margin (P. M.) can be thereby improved. A gain characteristic can also be flattened.

In the above-mentioned example, the pMOS transistor PM5 is employed as the variable resistor 13 (zero-point control resistor). The variable resistor 13 may be of course formed of an nMOS transistor. In this case, when the output current Iout of the pMOS transistor PM3 increases, the bias voltage may be reduced to increase the on resistance of the nMOS transistor. The zero-point frequency (CR time constant) may be thereby reduced. When the output current Iout of the pMOS transistor PM3 decreases, the bias voltage may be increased to reduce the on resistance of the nMOS transistor. The zero-point frequency may be thereby increased.

In the above-mentioned example, the differential pair of the differential amplifier unit is formed of the nMOS transistors. The polarity of the transistors may be changed, and pMOS transistors may be of course employed as the differential pair. In this case, the constant current source transistor may be formed of a pMOS transistor with a source thereof connected to the power supply VDD, a drain thereof connected to a common source of the differential pair of the pMOS transistors, instead of the nMOS transistor NM3. The load circuit (PM1, PM2) may be formed of a pair of nMOS transistors with sources thereof connected to the ground and drains thereof connected to drains of the differential pair of the pMOS transistors. The output transistor may be formed of an nMOS transistor. The Iout monitor circuit 11 may be formed of an nMOS transistor with a source thereof connected to the ground, instead of the pMOS transistor PM4. The bias voltage generation circuit 12 is formed of two stages of diode-connected pMOS transistors that are cascoded. The pMOS transistors are disposed between a drain of the nMOS transistor of the Iout monitor circuit 11 and the power supply VDD.

According to this example, a phase margin is flattened with respect to an output current in a non-inverting input type negative feedback amplifier circuit. Stability of the circuit can be thereby improved. As a result, the size of a compensation capacitor C connected to an outside in a related art circuit can also be reduced. The layout area can be thereby reduced, which leads to cost reduction. The present invention is especially effective for a voltage regulator with a wide output current (circuit load current) range. When the voltage regulator is divided into a plurality of voltage regulators according to the magnitude of the load current, the number of regulator circuits can also be reduced by adopting the circuit according to this example. In this manner, the voltage regulator in the above-mentioned example is suitable for being incorporated into a semiconductor device as a constant voltage circuit.

In the above-mentioned example, the voltage regulator was described as the non-inverting amplifier circuit. The present invention can be applied to the negative feedback amplifier circuit including a differential unit having a non-inverting input. In the above-mentioned exemplary embodiment, the MOS transistors were employed as the transistors used in the respective units. The MOS transistors may be field effect transistors (Field Effect Transistors), and various transistors such as MIS (Metal-Insulator Semiconductors) and TFT (Thin Film Transistors) may be used.

A bipolar type transistor may be employed for a part of the components of the present invention. The NMOS transistor (N-type channel MOS transistor) is a typical example of a transistor of a first conductivity type, while the PMOS transistor (P-type channel MOS transistor) is a typical example of a transistor of a second conductivity type.

Further, in the above-mentioned exemplary embodiment, description was given about the non-inverting amplifier circuit and a semiconductor integrated circuit device. The present invention may be provided to various logic devices, semiconductor devices, and semiconductor systems including the non-inverting amplifier circuit. The present invention, for example, may be applied to an SOC (system on chip), an MCP (multi-chip package), a POP (package on package), and an MCU (memory control unit), and the like.

Disclosure of Patent Document listed above is incorporated herein by reference thereto. Modification and adjustment of the exemplary embodiment are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A non-inverting amplifier circuit comprising:
a differential amplifier unit that receives an input signal at a non-inverting input thereof;
an output transistor that receives an output of the differential amplifier unit as an input, an output of the output transistor being fed back to an inverting input of the differential amplifier unit through a feedback path;
a phase compensation circuit including a capacitor and a variable resistor connected in series between the input of the output transistor and the feedback path for the output of the output transistor;

an output current monitor circuit that detects an output current flowing through the output transistor; and a circuit that varies a resistance value of the variable resistor of the phase compensation circuit in accordance with a result of the detection of the output current by the output current monitor circuit.

2. The non-inverting amplifier circuit according to claim 1, wherein the feedback path includes a feedback resistor having one end connected to the output of the output transistor and the other end connected to the inverting input of the differential amplifier unit, and the phase compensation circuit is connected between the other end of the feedback resistor and a connection node of the output of the differential amplifier unit and the input of the output transistor.

3. The non-inverting amplifier circuit according to claim 1, wherein the inverting input of the differential amplifier unit is connected to the output of the output transistor, and the phase compensation circuit is connected between the output of the output transistor and a connection node of the output of the differential amplifier unit and the input of the output transistor.

4. The non-inverting amplifier circuit according to claim 1, wherein a current which is a predetermined fraction of the output current flowing through the output transistor is made to flow through the output current monitor circuit, the output current monitor circuit monitoring the current which is the predetermined fraction of the output current.

5. The non-inverting amplifier circuit according to claim 1, wherein the variable resistor includes a field effect transistor, and the circuit that varies the resistance value of the variable resistor supplies to a gate of the field effect transistor a voltage corresponding to the result of the detection of the output current by the output current monitor circuit.

6. The non-inverting amplifier circuit according to claim 1, wherein the output current monitor circuit includes a field effect transistor that receives the output of the differential amplifier unit at a gate thereof, and the output current monitor circuit and the circuit that varies the resistance value of the variable resistor are connected in series between a high-potential side power supply and a low-potential side power supply.

7. The non-inverting amplifier circuit according to claim 6, wherein the circuit that varies the resistance value of the variable resistor includes a plurality of field effect transistors cascode-connected in a plurality of stages.

8. The non-inverting amplifier circuit according to claim 1, wherein the output current monitor circuit includes a transistor that receives, in common with the output transistor, the output of the differential amplifier unit.

9. The non-inverting amplifier circuit according to claim 5, wherein the transistor of the output current monitor circuit has capability of driving a current that is a predetermined fraction of the current of the output transistor.

10. The non-inverting amplifier circuit according to claim 1, wherein the circuit that varies the resistance value of the variable resistor includes a current-to-voltage conversion circuit that converts the current detected by the output current monitor circuit to a voltage to produce the resultant voltage.

11. The non-inverting amplifier circuit according to claim 8, wherein the circuit that varies the resistance value of the variable resistor includes a current-to-voltage conversion circuit that converts the current detected by the output current monitor circuit to a voltage to produce the resultant voltage.

12. The non-inverting amplifier circuit according to claim 9, wherein the circuit that varies the resistance value of the variable resistor includes a current-to-voltage conversion circuit that converts the current detected by the output current monitor circuit to a voltage to produce the resultant voltage.

13. The non-inverting amplifier circuit according to claim 10, wherein the circuit that varies the resistance value of the variable resistor includes a current-to-voltage conversion circuit that converts the current detected by the output current monitor circuit to the voltage to produce the resultant voltage.

14. The non-inverting amplifier circuit according to claim 10, wherein the output current monitor circuit includes a field effect transistor that receives the output of the differential amplifier unit at a gate thereof, and the output current monitor circuit and the current-to-voltage conversion circuit are connected in series between a high-potential side power supply and a low-potential side power supply.

15. The non-inverting amplifier circuit according to claim 11, wherein the output current monitor circuit includes a field effect transistor that receives the output of the differential amplifier unit at a gate thereof, and the output current monitor circuit and the current-to-voltage conversion circuit are connected in series between a high-potential side power supply and a low-potential side power supply.

16. The non-inverting amplifier circuit according to claim 12, wherein the output current monitor circuit includes a field effect transistor that receives the output of the differential amplifier unit at a gate thereof, and the output current monitor circuit and the current-to-voltage conversion circuit are connected in series between a high-potential side power supply and a low-potential side power supply.

17. The non-inverting amplifier circuit according to claim 13, wherein the output current monitor circuit includes a field effect transistor that receives the output of the differential amplifier unit at a gate thereof, and the output current monitor circuit and the current-to-voltage conversion circuit are connected in series between a high-potential side power supply and a low-potential side power supply.

18. The non-inverting amplifier circuit according to claim 14, wherein the current-to-voltage conversion circuit includes a plurality of field effect transistors cascode-connected in a plurality of stages.

19. The non-inverting amplifier circuit according to claim 15, wherein the current-to-voltage conversion circuit includes a plurality of field effect transistors cascode-connected in a plurality of stages.

20. The non-inverting amplifier circuit according to claim 16, wherein the current-to-voltage conversion circuit includes a plurality of field effect transistors cascode-connected in a plurality of stages.

21. The non-inverting amplifier circuit according to claim 17, wherein the current-to-voltage conversion circuit includes a plurality of field effect transistors cascode-connected in a plurality of stages.

22. A voltage regulator including the non-inverting amplifier circuit as set forth in claim 1.

23. A voltage follower including the non-inverting amplifier circuit as set forth in claim 1.

24. A semiconductor integrated circuit device including the non-inverting amplifier circuit as set forth in claim 1.

25. A method of performing phase compensation of a non-inverting amplifier circuit that includes a differential amplifier unit that receives an input signal at a non-inverting input thereof; an output transistor that receives an output of the differential amplifier unit as an input, an output of the output transistor being fed back to an inverting input of the differential amplifier unit through a feedback path; and a phase compensation circuit including a variable resistor and a capacitor connected in series between the input of the output transistor and the feedback path for the output of the output transistor, the method comprising:

monitoring an output current flowing through the output transistor; and
varying a resistance value of the variable resistor of the phase compensation circuit according to a result of the detection of the output current.

* * * * *